United States Patent [19]

Gysling

[11] 3,860,501

[45] Jan. 14, 1975

[54] PHOTOSENSITIVE COPPER (I) COMPLEXES AND THE USE THEREOF IN PHOTOGRAPHIC DEVELOPMENT

[75] Inventor: Henry J. Gysling, Rochester, N.Y.

[73] Assignee: Eastman Kodak Company, Rochester, N.Y.

[22] Filed: May 30, 1973

[21] Appl. No.: 365,376

[52] U.S. Cl. .................... 204/15, 96/38.4, 96/48 R, 96/48 PD, 96/88, 117/130 E, 117/212, 260/438.1, 204/38 B

[51] Int. Cl. ....... G03c 5/00, G03c 5/24, G03c 1/00

[58] Field of Search ........ 96/48 R, 48 PD, 88, 38.4; 204/38 B, 15; 260/438.1; 117/130 E, 212

[56] References Cited

UNITED STATES PATENTS

| | | | |
|---|---|---|---|
| 3,505,093 | 4/1970 | Schultz | 117/36.8 |
| 3,719,490 | 3/1973 | Yudelson et al. | 96/48 PD |
| 3,790,380 | 2/1974 | McKee | 96/48 PD |

*Primary Examiner*—Norman G. Torchin
*Assistant Examiner*—Won H. Louie, Jr.
*Attorney, Agent, or Firm*—A. H. Rosenstein

[57] ABSTRACT

A novel copper (I) complex having the formula $$Cu[P(OR)_3]_4BAr_4$$

wherein R is alkyl or aryl, and A*r* is aryl is employed as an actinic radiation sensitive element in an imaging process comprising imagewise exposing a support carrying the copper (I) complex to actinic light and developing an image by chemical or physical development. The complex has excellent speed and may be handled in room light prior to development.

19 Claims, No Drawings

PHOTOSENSITIVE COPPER (I) COMPLEXES AND THE USE THEREOF IN PHOTOGRAPHIC DEVELOPMENT

This invention relates to photography and more particularly to a novel copper (I) complex and a process of forming images in a light sensitive element comprising exposing a support carrying the photosensitive copper (I) complex to actinic light and developing the image.

U.S. Pat. NO. 3,658,534, issued Apr. 25, 1972, describes photosensitive polymers comprising simple metal salts bonded to oxygen, sulfur phosphorous, nitrogen, or halogen atoms by coordination bonds.

It is known in the art to employ certain copper (I) salts with silver halide emulsion layers to be exposed to actinic light and developed to an image. U.S. Pat. No. 3,565,622, issued Feb. 23, 1971, describes the use of cuprous thiocyanate with silver halide to form a visible image after development with an amine complexing agent. Additionally some species of copper (I) complexes with ligands and anions are described in S. J. Lippard and P. S. Welcher, Inorganic Chemistry, Vol. 11, No. 1, 1972 (pages 6 to 11).

Thermographic copy sheets incorporating certain copper (I) complexes as the heat sensitive component are described in U.S. Pat. No. 3,505,093, issued Apr. 7, 1970. This patent describes the imagewise exposure to heat of certain complexes to produce an image.

German Pat. No. 950,428, issued Oct. 11, 1956, describes the use of certain copper (I) salts such as cuprous chloride as photosensitive compounds. These salts are, however, insensitive to light in the dry state and must be moistened to provide light sensitivity. Further, the copper (I) salts have poor speed and are unstable in air.

The use of cuprous oxide as a photosensitive compound has been disclosed in British Pat. No. 1,306,362. These compounds, however, are not photosensitive to light unless moistened and are not colorless and leave an undesirable background with poor image differential.

No class of copper compounds has been found in the prior art that (A) will form a well defined image after (1) imagewise exposure to actinic light at comparative high speed and (2) development, (B) that can be handled in normal room light, (C) that can be exposed in a dry state, and (D) is stable to humidity and oxidation in the atmosphere.

It is appreciated that the photosensitive copper materials of the prior art are exceedingly slow speed in that they must be exposed to light or radiation for a long time in order to obtain a developable image. The novel copper (I) complexes of this invention are high speed in comparison with other copper materials and in most instances reach projection speed range which is less than $10^3$ ergs/cm$^2$.

The preparation of printed circuits has generally comprised the imagewise exposure of a photoresist material followed by removal of exposed or unexposed areas and etching and subsequent electroplating. This method is expensive, does not allow for room-light handling, the raw stock is generally unstable, the bleaching or etching steps pose solution disposal problems and requires a multitude of process steps in a great deal of equipment.

Accordingly, it is an object of this invention to provide a method of exposing a photosensitive copper material and developing an image that is resistant to oxidation and stable in the pressure of moisture.

It is another object of this invention to provide novel copper (I) complexes.

Still another object of this invention is to provide novel copper (I) complexes which form images after high speed, imagewise exposure to actinic light and physical development.

It is another object of this invention to provide a method of imagewise exposing copper (I) complexes to actinic light to form catalytic centers for development employing physical developers.

Still another object of this invention is to provide copper (I) complexes that have sensitivity restricted to the UV region allowing their imagewise exposure to actinic radiation and development under ambient lighting conditions.

Still an additional object of this invention is to provide printed circuits by coating a support with a photosensitive copper (I) complex and exposing imagewise to actinic light and developing the exposed portions of the element by physical development of the latent image.

These objects of the invention are accomplished by employing a novel actinic radiation sensitive copper (I) complex represented by the formula $$Cu[P(OR)_3]_4BAr_4$$

wherein R is alkyl or aryl and Ar is aryl as the light sensitive material in a process comprising imagewise exposing a support carrying a light sensitive material to actinic light and providing an image by either physical or chemical development.

The novel copper (I) complex is represented by the formula $$Cu[P(OR)_3]_4BAr_4$$

wherein R is either alkyl preferably containing from one to six carbon atoms such as methyl, ethyl, propyl, isopropyl, butyl, pentyl, hexyl and the like or aryl such as phenyl, tolyl, naphthyl, anthracenyl, ethyl phenyl, and the like preferably containing from 6 to 12 carbon atoms. Ar is aryl such as phenyl, naphthyl, tolyl, butyl phenyl, and the like preferably containing from 6 to 12 carbon atoms. Some examples of $BAr_4$ are tetraphenylborate
tetra-o-tolylborate
tetra-m-tolylborate
tetra-p-tolyborate
tetra-p-ethylphenylborate
tetra-p-propylphenylborate
tetra-3,4,5-trimethylphenylborate
tetra-m-methoxyphenylborate
tetra-p-methoxyphenylborate
tetra-p-ethoxyphenylborate
tetra-p-bromophenylborate
tetra-m-chlorophenylborate
tetra-p-chlorophenylborate
tetra-2,3,4,5-tetrachlorophenylborate
tetra-m-fluorophenylborate
tetra-p-fluorophenylborate
tetra-m-trifluoromethylphenylborate
tetra-p-trifluoromethylphenylborate
tetra-perfluorophenylborate
tetra-p-dimethylaminophenylborate tetra-p-acetamidephenylborate
tetra-4-biphenylborate
tetra-4-phenoxyphenylborate
tetra-1-naphthylborate
tetra-2-naphthylborate
tetra-9-anthranylborate
tetra-9-phenanthrylborate
tetra-2- phenylethynylborate
tetra-1-pyrrolylborate
tetrapyrazol-1-yl-borate
tetra-1-indolyborate
tetra-2-furylborate
tetra-5-methyl-2-furylborate
tetra-2-thienylborate
tetra-2-selenylborate and the like.

The terms "alkyl" and "aryl" as used herein include substituted alkyl and substituted aryl such as chloroethyl, bromophenyl, methyl phenyl, phenyl butyl, and the like. It is only necessary that the substituent not interfere with the photosensitivity of the complex.

Complexes useful herein are $$Cu[P(OCH_3)_3]_4B(C_6H_5)_4$$
$$Cu[P(OC_6H_5)_3]_4B(C_6H_5)_4$$
$$Cu[P(OC_2H_5)_3]_4B(C_6H_5)_4$$
$$Cu[P(OCH_3)_3]_4B(CH_3C_6H_4)_4$$
$$Cu[P(OCH_3C_6H_4)_3]_4B(C_6H_5)_4$$
$$Cu[P(OC_4H_9)_3]_4B(C_6H_5)_4$$

and the like.

Preferred complexes are $$Cu[P(OCH_3)_3]_4B(C_6H_5)_4$$

and $$Cu[P(OC_2H_5)_3]_4B(C_6H_5)_4$$

The novel complexes may be prepared by reacting cuprous salts such as cuprous chloride with a phosphite having the formula $$P(OR)_3$$

wherein R is as described above. The cuprous salt and the phosphite are generally mixed in an inert solvent such as chloroform, methylene chloride, ethylene chloride, and the like. The reactants may be mixed at room temperature without the aid of catalysts. To the reactants is added a salt of tetraarylboron such as sodium tetraphenylboron, generally in solution with a solvent such as ethanol or methanol or the like. The cuprous salt and phosphite are mixed at approximately 1:4 to 1:5 molar proportions. As the reaction is exothermic, the copper (I) complex is crystallized out by cooling, generally to about −15°C. to about 5°C.

Alternatively, the copper (I) complex may be prepared by reducing a copper (II) salt. This method entails reducing a cupric salt such as cupric chloride in a solvent such as ethanol or methanol, propanol or butanol with excess trialkyl phosphite or triaryl phosphite. The molar proportion of phosphite to cupric salt is generally from about 4.5:1 to about 6:1. The reactants including the alcohol may be mixed at room temperature if desired and without the aid of a catalyst. The resulting product is further reacted with a salt of tetraarylboron such as $NaB(C_6H_5)_4$. The molar proportion of tetraarylboron salt to the above reaction product may generally be equalmolar The copper (I) complex is then crystallized out by cooling, generally to about −15°C. to about 5°C.

If the copper (II) salt is reacted with triaryl phosphite $[P(OAr)_3]$ in the presence of a lower alkanol, a solvolysis occurs such as in the following reaction.

$4.5P(OAr)_3 + Cu(II) \xrightarrow{ROH} Cu[P(OR)_3]_4^+$ This can be further reacted with $NaB(C_6H_5)_4$ as illustrated above.

The photosensitive complex may be either imbibed into a support or coated onto a support in a polymeric binder, typically a hydrophilic binder prior to imagewise exposure. Thus, the substrate may be dipped in a bath of the complex and dried to render the element photosensitive or, if desired, the complex may be added to a binder solution and coated onto the support by any means, such as dip coating, brushing, rolling, spraying or the like and then dried. This method is specifically useful in forming printed circuits.

The binder used as a vehicle for the photosensitive complex may be any of the hydrophilic binders used in photographic elements, including natural materials such as gelatin albumin, agar-agar, gum arabic and alginic acid, and synthetic materials such as polyvinyl alcohol, polyvinyl pyrrolidone, cellulose ethers, partially hydrolyzed cellulose acetate and the like. The complex may be used with varying amounts of binder material. Preferably the complex to binder weight ratio is from about 3:1 to about 1:2.

The complex may be either imbibed into or coated onto any substrate typically used for photographic elements. Support materials used herein are subject to wide variation. Glass may be employed as may be metals such as aluminum, copper, zinc, and tin. Conventional film bases, such as cellulose acetate, cellulose nitrate, cellulose acetate butyrate, poly(ethylene terephthalate), polystyrene and paper are also used. The preferred support materials, when the process is to be used to form an element for use as a printed circuit are poly(ethylene terephthalate), polyimides, and cellulose acetate. The supports generally suitable for imbibing are porous supports such as paper. Generally the supports should contain from about 1 to about 200 mgs. per square foot of copper (I).

The coated support is dried and may then be stored for convenient periods of time prior to imagewise exposure as the complexes are not sensitive to ambient light, nor to the humidity in the atmosphere.

The elements are typically exposed through a pattern of actinic light providing a latent image corresponding to the exposed or unexposed areas. The complexes of this invention are sensitive to actinic light such as ultraviolet rays generally in the wavelength range of 1,800 to 4,000 Angstroms. Many sources of ultraviolet light may be used such as high vapor mercury lamps, carbon are lamps, and the like. It is noted that the novel complexes may be exposed at projection speed range which has been heretofore unattainable with copper materials.

The latent image in the exposed element can be developed into a desired metal image, typically a visible image, by either physical development or chemical development.

The physical development may take place in any conventional physical developing bath. The physical development bath generally contains metal ions in salt form and a reducing agent for the metal ions. Typical physical developer solutions are well known (see Hornsby, *Basic Photographic Chemistry*, (1956) 66, and Mees and James, ed. *The Theory of the Photographic Process*, 3rd edition (1966), 329–331, and U.S. Pat. No. 3,650,748 to Yudelson et al., issued Mar. 21, 1972) and contain the metallic ions such as silver, copper, iron, nickel, or cobalt necessary to form a visible image at and in the vicinity of the nucleating centers.

The preferred metal salts are water soluble salts such as silver nitrate, cupric salts such as copper chloride, copper nitrate, copper sulfate, copper formate, copper acetate and the like, and nickel salts such as nickel chloride, nickel bromide, nickel sulfate, nickel nitrate, nickel formate and the like.

Typical reducing agents used in the physical developer include, for example, polyhydroxy-substituted aryl compounds such as hydroquinones, catechols and pyrogallols; ascorbic acid derivatives; amino-phenols; p-phenylenediamines, and the like developing agents used in the photographic art. Particular examples of reducing agents for physical developer solutions are 2-methyl-3-chlorohydroquinone, bromohydroquinone, catechol, 5-phenyl-catechol, pyrogallol monomethyl ether (1-methoxy-2,3-dihydroxybenzene) and 5-methylpyrogallol monomethyl ether, isoascorbic acid, N-methyl-p-aminophenol, dimethyl-p-phenylene diamine, 4-amino-N,N-di(n-propyl) aniline and 6-amino-1-ethyl 1,2,3,4-tetrahydroquinoline and borane reducing agents such as amine boranes, borohydrides and the like.

The preferred physical development baths include the Copper Enthone developer baths (A trademark of Enthonics Corp.) containing copper sulfate, formaldehyde, Rochelle salt and nickel sulfate.

The physical developer solutions can, in addition to the metal salt, reducing agent, and a complexing agent such as Rochelle salt or other ligands for the metal salt, include a variety of other materials to facilitate maintenance and operation of the developer and to improve the quality of the developed image, such as acids and bases to adjust pH, buffers, preservatives, thickening agents, brightening agents, and the like. The rate of development can be increased, and hence the time of development decreased, by adding to the developer solution a surfactant such as an alkyl metal salt of a sulfated fatty acid, e.g., dodecyl sodium sulfate.

The proportions in which the various components of the physical developer are present in the developer solution can vary over a wide range. Suitable concentrations of reducible heavy metal salt can range from about 0.01 mole to about 1.0 mole of metal salt per liter of solution. The upper limit of concentration is dependent upon the solubility of the particular metal salt employed. Preferably, the solution is about 0.1 molar to about 0.3 molar with respect to the heavy metal salt. The relative proportions of metal salt and complexing agent are dependent upon the particular heavy metal salt or salts and the particular complexing agent or agents which are employed. As a general rule, sufficient complexing agent should be incorporated to "tie up" the reducible heavy metal ions which are in solution and to lessen the tendency of these metal ions to be reduced prior to use of the developer solution. Depending upon the particular heavy metal salt and the particular complexing agent which is employed, the amount of complexing agent present typically can vary from about 0.2 to about 10 moles of complexing agent per mole of metal salt present. Typically, the reducing agent can be present in amounts from about 0.01 mole to about 5 moles of reducing agent per mole of metal salt present in the solution. In order to permit the developer solution to be utilized for its maximum life, at least one equivalent of reducing agent should be present in the solution for each equivalent of reducible heavy metal salt.

The physical developers are operative over a wide range of pH. However, since the borane reducing agents undergo an acid catalyzed hydrolytic reaction which reduces their stability during storage, it is preferred that the physical developers be maintained at a moderately alkaline pH of about 8 to 11, and preferably of about 8.5 to 9.5. Nevertheless, the physical developers can be used under acidic conditions, as low as pH 3, if such conditions are advantageous for the particular photographic process in which they are used. The physical developer solution can be brought to the desired pH by addition of an appropriate amount of a suitable base; for example, ammonium hydroxide or sodium hydroxide, and can be maintained at the desired pH by addition of a suitable buffering system, for example, sodium carbonate and sodium bicarbonate. Other materials which can be used to adjust the pH to the desired range and buffers which will maintain the pH in that range can be readily determined by those skilled in the art.

The exposed elements may be developed chemically by immersing in solutions comprising amino phenols, phenylenediamines, hydroquinones, amino-dialkylanilines, heterocyclic chemical developers such as phenyl pyrazolidone and the like. A complete description of chemical developers which may be used herein can be found in Mees and James, *The Theory of the Photographic Process*, 3rd Edition, Chapter 13 (1966).

The process outlined above may yield a positive or negative image depending on the complex used and the physical development process. Thus, a negative image may be obtained by physically developing any of the copper (I) complexes of this invention with a copper physical developer and the complex having the formula $$Cu[P(OC_2H_5)_3]_4B(C_6H_5)_4$$

may be developed with a nickel developer to a positive image. It is noted that a negative image may be attained using this complex by developing with a copper physical developer.

The developed elements of the invention are especially advantageous as they have add-on capabilities. That is, the complexes remaining in the undeveloped areas are not affected by room light and portions of the developed element may be further imagewise exposed to actinic light and developed to produce an additional image on the element.

The process of this invention is particularly useful in forming elements for use as printed circuits. In this method, insulating supports are either imbibed with the copper (I) complexes or coated with the complexes in a binder and dried. The coated supports are imagewise exposed to actinic light so that the exposed portions are catalytic to the deposition of a metal such as copper, silver or nickel by physical development. The exposed element is then physically developed in a metal salt containing bath such as in a copper physical development bath and the metal such as copper is deposited and built up on the exposed portions of the element only. The element may then be dried, and if desired, a heavier build up of metal may be achieved in the exposed areas by electroplating over the element. The completed element may then be used to form a printed circuit. This method is simple and inexpensive and requires no addenda or special equipment.

The following examples are included for a further understanding of the invention.

Example 1

A copper (I) complex was formed by adding 2.6 g of cuprous chloride to a solution of 30 ml of triethyl phosphite in 200 ml of chloroform. A clear, colorless solution resulted after brief stirring. To the solution was added a solution of 10.3 g of sodium tetraphenylboron in 80 ml of ethanol. After stirring for 1 hour, the solution was diluted to 2 liters with ethanol and 600 ml of methanol was added. The solution was cooled for 5 days in a freezer and a heavy crop of white crystals had deposited. The crystals were filtered on a coarse sintered glass filter, washed with ethanol, and vacuum-dried. A yield of 16.2 g of a complex having the formula $$Cu[P(OC_2H_5)_3]_4B(C_6H_5)_4$$

was obtained. The complex was soluble in benzene, chloroform, methanol and ethyl ether but only slightly soluble in ethanol. The solid state reflectance spectrum of the complex showed an absorption maximum at 280 nm.

Example 2

A copper (I) complex was prepared by adding 4.8 g of $Cu(NO_3)_2.3H_2O$ to a solution of 10 ml of 2,2-dimethoxypropane in 30 ml methanol. After stirring for 5 minutes the solution was cooled in an ice bath and 35 ml of trimethyl phosphite was slowly added. To the solution was then added 6.8 g of $NaB(C_6H_5)_4$ in 40 ml of methanol. The resulting white precipitate was filtered, washed with methanol and ether, and vacuum-dried for 20 hours over $P_2O_5$.

The yield was 8.3 g of a complex having the formula $$Cu[P(OCH_3)_3]_4B(C_6H_5)_4$$

which was soluble in acetone and chloroform but insoluble in ether. The solid state reflectance spectrum of the complex showed an absorption maximum at 278 nm.

Example 3

The procedure of Example 2 was repeated substituting triphenylphosphite for the trimethylphosphite. Due to the solvolysis reaction, the same product was achieved.

Example 4

The procedure of Example 2 was repeated substituting tri-p-tolyl phosphite for the trimethylphosphite and the resulting product had the formula $$Cu[P(OCH_3)_3]_4B(C_6H_5)_4$$

Example 5

A copper (I) complex was prepared by adding 35 ml of $P(OC_6H_5)_3$ to 3.4 g of Cu $Cl_2.2H_2O$ in 75 ml n-butanol. To the clear solution was added 250 ml of methanol and a solution of 6.8 g of $NaB(C_6H_5)_4$ in 75 ml of methanol. The solution was cooled in a freezer overnight and the resulting white crystals were filtered out and vacuum-dried. A yield of 11 g of a complex having the formula $$Cu[P(OC_4H_9)_3]_4B(C_6H_5)_4$$

was obtained. The complex was soluble in chloroform, acetone and ether but insoluble in ethanol.

Example 6

A solution was prepared by dissolving one g of the copper (I) complex prepared in Example 1 in 40 ml of a 10 percent by weight solution of cellulose acetate in acetone-methoxyethanol (50 : 50 V/V). The solution of complex and binder was coated on gel-subbed poly-(ethylene terephthalate) at a 3 mil wet thickness.

The coated support was imagewise exposed to actinic light under a 360-watt Gates lamp for 30 seconds and a distance of 12 inches. The image was developed by immersing the coated support in a solution of 50 mg hydrazine-bisborane in 50 ml of a nickel solution comprising 68.75 g of $NiCl_2.6H_2O$
45 g ethylenediamine
225 g K $CH_3CO_2$
3 liters $H_2O$ The resulting element had a nickel deposit only in the unexposed areas of the film.

A positive image was achieved by immersing another sample of the exposed coated support in a physical developer comprising 65 mg of methyl hydrazinebisborane dissolved in 100 ml of the above nickel solution.

Example 7

The coated support of Example 6 was imagewise exposed to actinic light for 10 seconds under a Gates lamp at a distance of 12 inches. The image was developed by immersing in a Copper Enthone developer containing copper sulfate, formaldehyde, Rochelle salt, and nickel sulfate at 70°C. A heavy black copper deposite was formed in the exposed areas only.

The threshold exposure at 254 nm of samples of the film of Examples 6 and 7 was determined by irradiating at 254 nm with a UVS–11 Mineralight lamp through a series of neutral density filters. The minimum exposure necessary for development in the nickel developer of Example 6 was found to be $1.08 \times 10^5$ ergs/cm$^2$ and the minimum exposure necessary for development in the developer of Example 7 was found to be 3800 ergs/cm$^2$. This is compared to a similar copper (I) complex having the formula $Cu[P(C_6H_5)_3]_3BH_3CN.CHCl_3$ which when subjected to the same exposure and development required a minimum exposure of $1.1 \times 10^6$ ergs/cm$^2$.

Example 8

A paper support was imbibed with a solution of 1 g of the copper (I) complex of Example 2 dissolved in 20 ml of acetone. The coated support was imagewise exposed to actinic light under a UVS-11 Mineralight lamp for 10 seconds at a distance of 1.5 centimeters. A yellow coloration was produced in the exposed area. The exposed element was placed under fluorescent lighting for 2 days and no change in the image was observed. The exposed element was developed by immersing in a Copper Enthone developer at 65°C. for 60 seconds. A dark copper image was developed in the exposed areas only. The minimum exposure necessary for development here was found to be only 870 ergs/cm$^2$.

Another sample of the coated strip was imagewise exposed to actinic light under a Model 437 Nano Pulser (Xenon Corporation) in different areas with from 1 to 4 pulses. Subsequent immersions in the Copper Enthone developer for 30 seconds resulted in an image formed in all 4 irradiated areas.

Example 9

A film was prepared by dissolving 0.5 g of the copper (I) complex of Example 2 in 10 ml of a 10 percent by weight 50 : 50 V/V acetone-methoxyethanol solution of cellulose acetate and coating the solution on a unsubbed cellulose acetate film base at a wet thickness of 6 mils.

The coated film was imagewise exposed to actinic light under a UVS –11 Mineralight lamp for 5 seconds at a distance of 1.5 cm. After a 2-minute immersion in Copper Ethone Developer at 70°C., a copper image was developed in the exposed areas only.

Example 10

A paper support was imbibed with a solution of 0.5 g of the copper (I) complex of Example 5 in 10 ml of acetone and imagewise exposed to actinic light under a UVS–11 Mineralight lamp for 10 seconds at a distance of 1.5 cm.

The exposed element was immersed in a Copper Enthone developer for 4 minutes at 70°C. and a copper image was developed in the exposed areas only.

Example 11

The substantial enhancement of photosensitivity of the novel copper complexes of this invention was demonstrated by comparing the development of these complexes to that of similar copper (I) phosphite complexes in the following manner:

Paper supports were imbibed in solutions of $Cu[P(OCH_3)_3]_4NO_3$ and $Cu[P(OCH_3)_3]_4Cl$ and imagewise exposed to actinic light under the UVS–11 Mineralight lamp at a distance of 1.5 cm. for 5 minutes and immersed in the Copper Ethone developer for several minutes and only a trace of physical development appeared before fog appeared in the unexposed areas.

This was compared to the 10 second exposure and 90 second development obtained using the complex of Example 1 to form a completely developed image and the 5 second exposure and 60 second complete development obtained using the complex of Example 2.

The threshold exposures for development in Copper Enthone developers at 60°C for the complexes of Examples 1 and 2 at 275 nm are 430 ergs/cm$^2$ and 150 ergs/cm$^2$ respectively while the threshold exposures for the complexes $Cu[P(OCH_3)_3]_4NO_3$ and $Cu[P(OCH_3)_3]_4Cl$ are substantially higher than 1 million ergs/cm$^2$.

Example 12

A solution comprising 10 ml of a 20 percent by weight solution of poly(ethylacrylate-acrylic acid) in chloroform, 10 ml of a copper (I) complex having the formula $Cu[(OCH_3)_3P]_4\,[B(C_6H_5)_4]$ in chloroform (10 percent weight by volume solution), and 4 drops of 1,4-butanediol diglycidylether was coated onto a poly(ethyleneterephthalate) support at a wet thickness of 5 mils. The coating was cured by heating at 40°C overnight.

A printed circuit was prepared by imagewise exposing the dried element to a low pressure mercury arc through a stainless steel mask for 30 to 60 seconds. The exposed element was then physically developed in a 1 : 1 Copper Enthone 400A–400B physical development bath for 10 to 20 minutes at 32°C.

The latent image was stable for 3-5 days and the process was carried out under fluorescent light and normal room illumination with no resultant fog. The printed circuit also was capable of being added onto by reexposing and developing with no fog appearing in either the first or second image areas.

Example 13

A printed circuit was prepared by imbibing a support with a solution comprising 2.5% $Cu[P(OCH_3)_3]_4B(C_6H_5)_4$ in chloroform for 10 seconds. The coated support was imagewise exposed to a low pressure mercury arc at 254 nm through a stainless steel mask for 30 to 60 seconds and developed in Copper Ethone developer at 32°C. for 15 minutes.

Example 14

A solution of 0.5 g $Cu[P(OCH_3)_3]_4B(C_6H_5)_4$ in 20 ml of 10 percent by weight cellulose acetate solution in 1:1 acetone methoxyethanol was coated on an unsubbed poly(ethylene terephthalate) to a wet thickness of 6 mils. The coated film was imagewise exposed for 5 seconds under a 360-watt Gates lamp at a distance of 12 inches and developed in the exposed areas by immersing in a Copper Enthone developer solution at 40°C.

The add-on property of this novel complex was demonstrated by allowing the developed element to stand for 24 hours under ambient conditions and then subjecting the developed film to an additional 5 seconds of a Gates lamp imagewise exposure. After immersion in the Copper Enthone developer, development in the areas exposed to the UV source during the second exposure as well as a build up of the copper deposit in the areas developed after the first exposure was achieved.

Example 15

A solution of 5 g of $Cu[P(OCH_3)_3]_4B(C_6H_5)_4$ in 50 ml acetone was imbibed into a paper support and dried. The coated paper was exposed imagewise for 5 seconds under a UVS–11 Mineralight lamp at a distance of 1.5 cm. and chemically developed by immersing for 10 seconds in a solution containing 130 g of paraformaldehyde plus 120 g KOH and 1 liter of water. Amplification of the invisible latent image to a visible black image was achieved. The threshold exposure value at 254 nm for this chemical development was $3 \times 10^3$ ergs/cm$^2$.

Although the invention has been described in considerable detail with reference to certain preferred embodiments thereof, it will be understood that variations and modifications can be effected without departing from the spirit and scope of the invention as described hereinabove.

We claim:

1. A photographic composition comprising a hydrophilic polymeric binder and a copper (I) complex having the formula $$Cu[P(OR)_3]_4BAr_4$$

wherein R is alkyl containing from about one to six carbon atoms or aryl containing from about 6 to about 12 carbon atoms and Ar is aryl containing from about 6 to about 12 carbon atoms.

2. The composition of claim 1 wherein the weight ratio of complex to binder is from 3:1 to 1:2.

3. A photographic element comprising a support and a photosensitive copper (I) complex having the formula $$Cu[P(OR)_3]_4BAr_4$$

wherein R is alkyl containing from one to six carbon atoms or aryl containing from 6 to 12 carbon atoms and Ar is aryl containing from 6 to 12 carbon atoms in a hydrophilic polymeric binder.

4. The photographic element of claim 3 wherein the weight ratio of complex to binder is 3:1 to 1:2.

5. A photographic element comprising a support having inbibed therein a photosensitive copper (I) complex having the formula $$Cu[P(OR)_3]_4BAr_4$$

wherein R is alkyl containing from one to six carbon atoms or aryl containing from 6 to 12 carbon atoms and Ar is aryl containing from 6 to 12 carbon atoms.

6. In a process of developing an image in a light sensitive element comprising a support and a light sensitive copper material imbibed into said support or dispersed in a hydrophilic polymeric binder and coated onto said support by contacting the copper material with a chemical developer comprising a reducing agent or physical developer comprising a metal salt and a reducing agent therefor the improvement comprising employing as said light sensitive copper material a light sensitive copper (I) complex represented by the formula $$Cu[P(OR)_3]_4BAr_4$$

wherein R is alkyl containing from one to six carbon atoms or aryl containing from 6 to 12 carbon atoms and Ar is aryl containing from 6 to 12 carbon atoms.

7. The process of claim 6 wherein R is alkyl containing from one to six carbon atoms and Ar is phenyl.

8. The process of claim 7 wherein the copper (I) complex has the formula $$Cu[P(OCH_3)_3]_4B(C_6H_5)_4.$$

9. The process of claim 7 wherein the copper (I) complex has the formula $$Cu[P(OC_2H_5)_3]_4B(C_6H_5)_4.$$

10. In a process of developing an image in a light sensitive element comprising a support having coated thereon a light sensitive copper material by contacting the copper material with a chemical developer comprising a reducing agent or a physical developer comprising a metal salt and a reducing agent therefor, the improvement comprising imbibing into the support a solution of a copper (I) complex having the formula $$Cu[P(OR)_3]_4BAr_4$$

wherein R is alkyl containing from one to six carbon atoms or aryl containing from 6 to 12 carbon atoms and Ar is aryl containing from 6 to 12 carbon atoms.

11. In a process of developing an image in a light sensitive element comprising a support having coated thereon a light sensitive copper material by contacting the copper material with a chemical developer comprising a reducing agent or physical developer comprising a metal salt and a reducing agent therefor the improvement comprising coating the support with a copper (I) complex having the formula $$Cu[P(OR)_3]_4BAr_4$$

whrein R is alkyl containing from one to six carbon atoms or aryl containing from 6 to 12 carbon atoms and Ar is aryl containing from 6 to 12 carbon atoms, in a hydrophilic binder, and subsequently developing an image.

12. The process of claim 11 wherein the hydrophilic binder is cellulose acetate.

13. The process of claim 6 wherein the latent image is developed in a physical development bath comprising a metal salt and a reducing agent therefor.

14. The process of claim 13 wherein the physical development bath contains a copper salt and a reducing agent therefor.

15. The process of claim 13 wherein the physical development bath contains a nickel salt and a reducing agent therefor.

16. The process of claim 6 wherein the latent image is developed in a chemical development bath comprising a reducing agent.

17. The process of claim 16 wherein the chemical development bath contains paraformaldehyde.

18. The process of claim 6 wherein subsequent to developing the image, the unexposed portions of the coated support are imagewise exposed to actinic light and the resulting second latent image is chemically or physically developed to an additional image.

19. A method of forming a printed circuit comprising

A. (1) dispersing into a hydrophilic polymeric binder a copper (I) complex having the formula $Cu[P(OR)_3]_4BAr_4$ wherein R is alkyl from one to six carbon atoms or aryl containing from 6 to 12 carbon atoms and Ar is aryl containing from 6 to 12 carbon atoms or (2) imbibing a support with a copper (I) complex having the formula $Cu[P(OR)_3]_4BAr_4$ wherein R is alkyl from one to six carbon atoms or aryl containing from 6 to 12 carbon atoms and Ar is aryl containing from 6 to 12 carbon atoms, B. imagewise exposing the coated support to actinic light and C. physically developing metal on the exposed areas from a physical development bath comprising a metal salt and a reducing agent therefor and D. electroplating additional metal over the physically developed metal image to build up the metal layer.

* * * * *